United States Patent [19]

Belisomi

[11] 4,373,208
[45] Feb. 8, 1983

[54] CIRCUIT ARRANGEMENT FOR TUNING INTO ONE OF A NUMBER OF RADIOELECTRIC SIGNALS

[75] Inventor: Pietro Belisomi, Pinerolo, Italy

[73] Assignee: Indesit Industria Elettrodomestici Italiana S.p.A., Italy

[21] Appl. No.: 971,073

[22] Filed: Dec. 19, 1978

[30] Foreign Application Priority Data

Dec. 30, 1977 [IT]  Italy ................ 69950 A/77

[51] Int. Cl.³ ............................... H03J 5/00
[52] U.S. Cl. .................... 455/186; 455/164; 455/166; 455/173; 455/185
[58] Field of Search ............ 325/464, 467, 468, 469, 325/470, 452, 453, 455, 459; 455/161, 164, 165, 169, 179, 182, 185, 186, 192, 196, 257, 259, 260

[56] References Cited

U.S. PATENT DOCUMENTS

| | | | |
|---|---|---|---|
| 3,841,394 | 10/1974 | Hamada | 325/464 |
| 4,013,957 | 3/1977 | Tojo | 325/464 |
| 4,024,476 | 5/1977 | Briggs | 455/185 |
| 4,078,613 | 3/1978 | Campioni | 325/464 |
| 4,122,395 | 10/1978 | Schotz | 455/186 |
| 4,128,849 | 12/1978 | Rhee | 455/185 |
| 4,161,708 | 7/1979 | Friberg et al. | 325/464 |
| 4,236,251 | 11/1980 | Ohgishi | 455/186 |
| 4,261,055 | 4/1981 | Farina | 455/186 |

FOREIGN PATENT DOCUMENTS

| | | |
|---|---|---|
| 1538294 | 1/1979 | United Kingdom . |
| 1538295 | 1/1979 | United Kingdom . |
| 1540459 | 2/1979 | United Kingdom . |
| 1550413 | 8/1959 | United Kingdom . |

Primary Examiner—Tommy P. Chin
Attorney, Agent, or Firm—Lerner, David, Littenberg & Samuel

[57] ABSTRACT

A circuit arrangement for tuning into one of a number of radioelectric signals receivable on a signal receiver set is provided in accordance with the teachings of the present invention. The circuit arrangement consists of a controllable oscillator, whose frequency is determined by a control loop, in accordance with a binary number N. The binary number N is supplied by a processing unit on the basis of coded input data. Within the control loop, frequency division occurs so that a first signal is obtained from the controllable oscillator which is dependent at least on the number N. This first signal is then compared with a second reference frequency signal, to obtain a third signal for required tuning. A memory with a number of storage locations for storing data relative to signals tuned in digital form is also provided. The storage locations of the memory are scanned sequentially, either automatically or manually, step-by-step, and the number N is supplied both in direct response to coded input data and by calling up data from the memory whereupon the processing unit, in response to a first coded input signal, is set to generate a first sequence of N numbers, corresponding to the total number of receivable radioelectric signals, according to a pre-established transmission standard and, in response to a second coded input signal, advances through one step of this sequence.

28 Claims, 10 Drawing Figures

CIRCUIT ARRANGEMENT FOR TUNING INTO ONE OF A NUMBER OF RADIOELECTRIC SIGNALS

The present invention relates to a circuit arrangement for tuning into one of a number of radioelectric signals receivable on a signal receiver set, consisting of a controllable oscillator, the frequency of which is determined by a control loop, depending on a binary number N, sent out by a processing unit on the basis of coded input data, the said loop consists of frequency-dividing means to obtain from the said controllable oscillator a first signal dependent at least on the said number N; means for comparing the said first signal with a second frequency reference signal, to obtain a third signal for required tuning; memory means having a number of storage locations for storing data relative to the signals to be tuned in digital form; means for scanning the said cells of the said memory means and, finally, means for supplying the said number N both in direct response to the said coded input data and by calling up data from the said memory means.

Circuit arrangements of this type, suitable, in particular, for a television receiver, are described in British Pat. Nos. 1,538,294; 1,538,295; 1,550,413 and 1,540,459 made by the present applicant.

These arrangements provide for considerable improvement in receiver design as compared with known systems, especially as regards precision and tuning stability out have a number of drawbacks. In particular, no provision is made in these arrangements for automatic scanning of receivable channels or tuning into stations transmitting over non-standard frequencies. Also, they are fairly complex which makes modification difficult. The aim of this invention is to provide a perfected circuit arrangement to overcome these known drawbacks.

With this aim in view, the present invention relates to a circuit arrangement for tuning to one of a number of radioelectric signals receivable on a signal receiver set, consisting of a controllable oscillator, the frequency of which is determined by a control loop, depending on a digital number N, sent out by a processing unit on the basis of coded input data, the said loop consisting of frequency-dividing means to obtain from the said controllable oscillator a first signal dependent at least on the said number N; means for comparing the said first signal with a second frequency reference signal, to obtain a third signal for required tuning; memory means having a number of storage locations for storing data relative to the signals to be tuned into in digital form; means for scanning the said cells of the said memory means sequentially, either automatically or manually step-by-step, and, finally, means for supplying the said number N both in direct response to the said coded input data and by calling up data from the said memory means, characterised by the fact that the said processing unit, in response to a first coded input signal, is set to generate a first sequence of N numbers, corresponding to the total number of receivable radioelectric signals, according to a pre-established transmission standard, and, in response to a second coded input signal, advances one step of the said first sequence.

For a clearer understanding of the invention, it will now be described with reference to the attached drawings provided by way of a non-limiting example in which.

Figure 1:
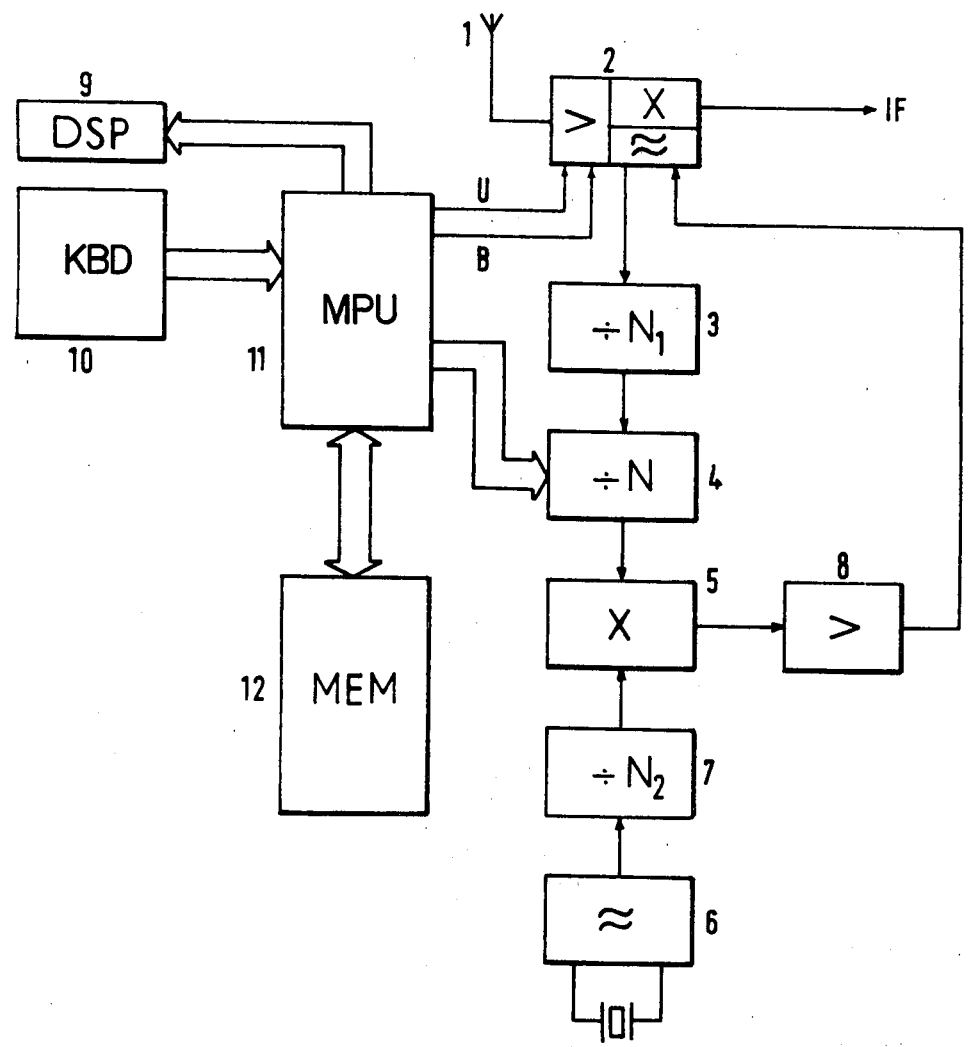
FIG. 1 shows the block diagram of part of a television receiver according to the present invention.

Number 1 in FIG. 1 is a receiver aerial connected to varicap-diode tuner 2, at the output of which a signal converted to intermediate frequency IF is available.

The tuner is of the known type and essentially consists of a selective amplifier stage, a mixer circuit and a local oscillator circuit. One of the local oscillator circuit outputs is connected to a first frequency-dividing circuit 3 which divides by a fixed number N 1. This has its output connected to the signal input of a second divider, 4, which divides by a variable number N with 12-bit programming which means it can divide by any number from 1 to $2^{12}$. The output of divider 4 is connected to the first input of a phase- and frequency-comparing circuit, 5, the second input of which receives, via a third frequency-dividing circuit, 7, a reference signal, generated by quartz generator 6, and the output of which is connected, via amplifier and filter circuit 8, to the varicap-diode-voltage test input of the tuning circuit.

Number 10 is a control element connected to a group of inputs on a processing unit 11. Of this, a group of input-output terminals is connected to a memory circuit 12, a first group of output terminals to a display system (DSP) 9, a second group of 12 output terminals to the programming input of 12-bit divider 4 and 2 outputs U and B to the corresponding test inputs of tuner 2.

Operation of the circuit will now be described with reference to FIG. 2 also in which 9, 10, 11 and 12 indicate in more detail the blocks shown with the same numbers in FIG. 1.

Control element (10) is a keyboard with 10 numbered keys (0–9), 6 auxiliary keys marked I, D, M, $R_1$, $R_2$ and $R_3$, other accessory control keys, two of which marked + and −, as well as others not shown in the diagram, such as the on/off switch, temporary audio cut-out key, data display key, etc.

Display system 9 consists of 4 LED-diode alphanumerical indicators. The processing unit 11 includes two 8-bit output circuits (ports) PA and PB. The first output circuit and first 4 bits of the second supply the programming signal for divider circuit 4, while another 2 bits of the second supply tuner 2 with band-switch signals U and B.

Memory circuit 12 is arranged in 8-bit words (bytes) and consists of 3 blocks marked RAM1, RAM2 and ROM.

The first (RAM1) consists of a non-volatile read/write memory containing registers K0-K9, S0-S9, RA and RB. The second (RAM2) consists of a read/write memory containing registers MO, K, S, C, F, RX, INT and T.

The third (ROM) is a read-only programme memory, that is, it contains in coded form the sequence of basic logic functions to be performed by the processing unit.

The circuit operates as follows:

Circuits 3, 4, 5 and 8, together with the varicap-diod-controlled (VCO) local oscillator on tuner 2, form a phase lock loop controlled by the reference signal generated by quartz generator 6 and divided by divider circuit 7 according to known techniques.

The function of divider circuit 3 is to reduce the frequencies involved to more easily processed levels while programmable divider 4 enables phase locking to be affected at different local oscillator frequencies by creating a frequency synthesizing circuit.

In fact, when a number of divisions N is selected for divider 4, phase-frequency comparator 5 supplies circuit 2, through amplifier 8, with a voltage to bring about the following condition:

$$f_6/N_2 = f_2/N_1 \times N \text{ or} \qquad (1)$$

$$f_2 = P \times N \text{ in which:} \qquad (2)$$

$f_2$ is the oscillation frequency of the local oscillator in tuner 2; $f_6$ is the oscillation frequency of reference oscillation circuit 6; $N_2$, $N_1$ and $N$ are the division ratios of dividers 7, 3 and 4 respectively; $P = f_6 \cdot N_1/N_2$ indicates the variation in local oscillator frequency alongside a variation in number N.

The receiver must be capable of tuning into emitter stations of a specific transmission standard, e.g. C.C.I.R/B-G, with channeling as agreed at the European Broadcasting Conference held in Stockholm (1961), that is, with one-step spacing of emitter stations between 7 MHz adjacent channels on (VHF) bands I and II and 8 MHz channels on (UHF) bands IV and V with a 5 MHz video signal bandwidth.

These emittter stations fall within the 2-69 television channel range (video carrier frequencies 48.25 MHz and 855.25 MHz respectively) with an intermediate frequency IF of 38.9 MHz. The local oscillator on the tuner must therefore be capable of generating frequencies ranging from 87.15 to 894.15 MHz.

The step P selected was 0.25 MHz, so that, for the two channels mentioned above, equation 2 gives the following results:

$$N_{min} = 87.15/0.25 \approx 87/0.25 = 348$$

$$N_{max} = 894.15/0.25 \approx 894.25/0.25 = 3577$$

By varying number N between these two limits, any television channel on the VHF and UHF bands can be tuned into with a maximum error of 125 KHz.

As use of this frequency range is incomplete, the tuner has two band-switch inputs U (UHF/VHF) and B (BIII/BI) which ensure only effective bands are covered.

Divider 3 is a high-speed ECL which divides by 64 (SP 8750 type as available from Plessey Semiconductors). Divider 4 is a programmable TTL capable of operating up to frequencies of roughly 15 MHz ($3 \times SN74LS191$), as available from Texas Instruments. Circuits 5, 6 and 7 consist of an SP8760 integrated circuit as available from Plessey Semiconductors with 250 KHz frequency quartz and an N2=64 division ratio so that comparator circuit 5 operates at 3906.25 Hz frequency equivalent to a quarter of line frequency.

The function of amplifier-filter 8 is to adapt the output level of comparator 5 (max. 5 V) to that required by tuner 2 (max. 30 V) as well as to provide the best possible filtering and locking speed conditions.

The function of circuits 11 and 12 is to generate N numbers and band-switch signals for tuning into specific television emitter stations on the basis of data relative to the signals to be tuned into, supplied either by the operator on keyboard 10 or called up from the memory circuits.

Figure 2:
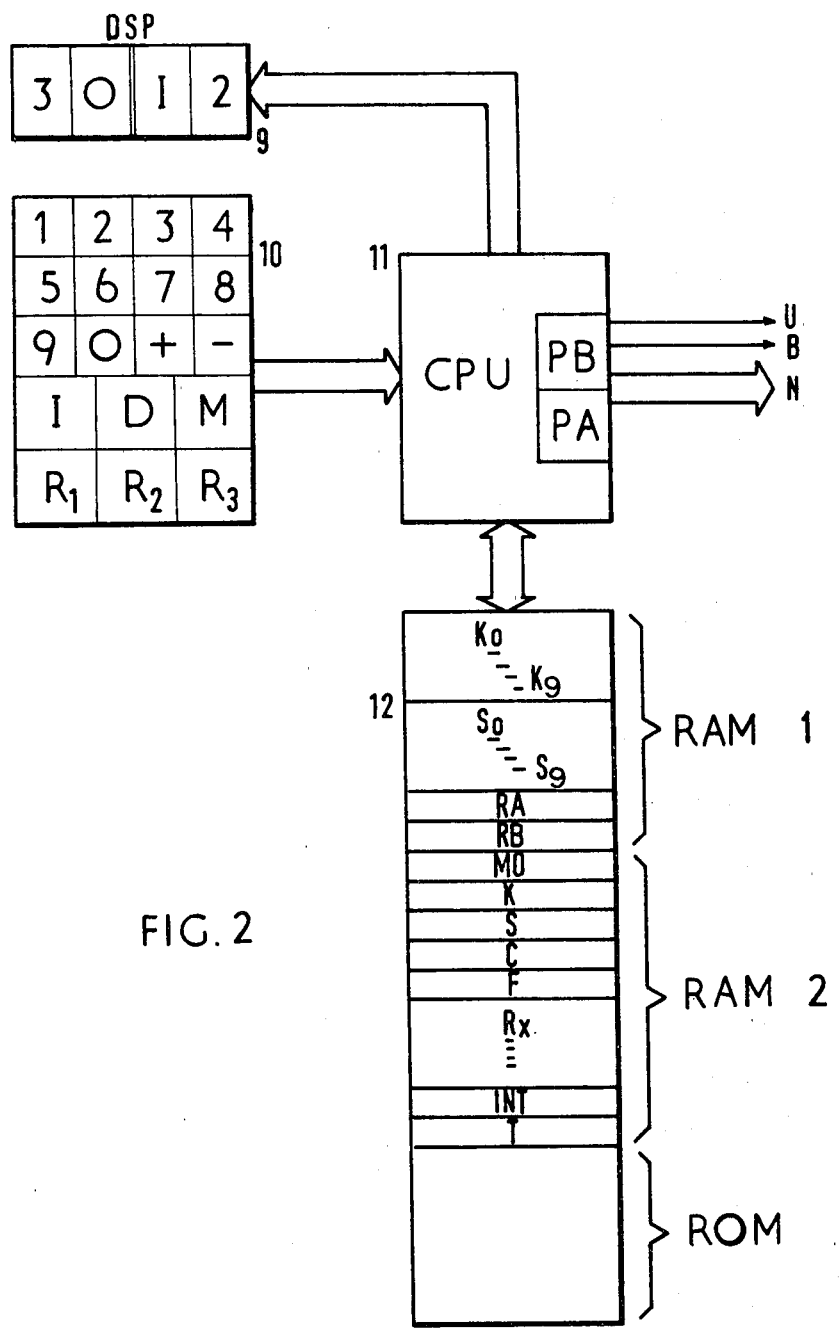
FIG. 2 shows a number of FIG. 1 circuits in more detail.

As shown in FIG. 2, RAM 2 contains registers K, S, C and F. For tuning into a given station, the following data is loaded into the registers, as described later on: channel number (K), tuning correction (S), constant correction (C) and multiplication factor (F) which depends on the step between two adjacent channels. Number N is calculated as follows:

$$N = (KF + C)4 + S \qquad (3)$$

starting with the data contained in the above registers and performing the arithmetical operations shown in equation 3 with a sequence of elementary operations (additions and displacements) using the arithmetical logic circuits (ALU) on the processing unit (CPU) according to the instructions in the ROM (programme). The constant correction (C) and factor (F) depend solely on the band selected. K is the channel number according to the said standard and S has a constant initial value of $S_c$ which can be modified for fine tuning corrections as opposed to nominal tuning, that is, for making small displacements of local oscillator frequency as compared with video band width, as shown on the following table:

TABLE 1

| | K | F | C | $S_c$ | U | B |
|---|---|---|---|---|---|---|
| BI | 2–4 | 7 | 69 | 16 | 0 | 0 |
| BIII | 5–12 | 7 | 175 | 16 | 0 | 1 |
| UHF | 21–69 | 8 | 338 | 16 | 1 | 0 |

In fact, taking channel 69 as an example, the above table and equation 3 gives:

$$N = (69 \times 8 + 338)4 + 16 = 3576$$

which corresponds to a local oscillator frequency of 894 MHz (equation 2) or rather, optimum tuning of channel 69 with a slight displacement towards the video.

By merely changing the channel number in register K, we get exclusively all the frequencies corresponding to television channels, that is, with 8 MHz spacing in UHF and 7 MHz in VHF as shown in the above equations.

Starting with the selected channel number K, preset additional data F and C are selected automatically from among possible data stored in the ROM, as are band-switch signals U and B, according to Table 1.

Tuning correction S, on the other hand, can be modified between minimum and maximum values of 0 and 31, corresponding to a tuning displacement of roughly $\pm 4$ MHz as compared with the nominal condition. This is to allow for small tuning corrections, sometimes necessary to compensate for flaws on the transmission channel, as well as for tuning into non-standard-frequency emitters. Equation 3 is calculated in pure binary form, also using a number of temporary rescue registers for partial results RX. The resulting value of N together with the results for U and B (total 14 bits) are distributed and sent to the output circuits (ports): the 8 least significant bits of N to PA and the 4 most significant bits of N, B and U to PB. The channel number K (contained in the relative register) is also displayed by 2 figures in display circuit 9. The content of channel register K and tuning register S is also transferred to the two cells RA and RB of the non-volatile memory for automatic tuning of the last channel tuned when the television set is turned on.

By means of appropriate controls on keyboard 10, five types of station tuning are possible, plus tuning correction and storage of 10 preferred stations.

Normally, the processing unit performs a main keyboard reading programme (a sequence of instructions registered in the ROM) to identify the presence and type of input data.

If one of the accessory keys I, D, $R_1$, $R_2$ or $R_3$ is pressed, the corresponding coded input data is stored in register MO which identifies the operating mode. Each of these modes provides for performing a given sub-routine for processing any data entered by the 10 numbered keys.

The programme initiated upon a depression of key I is the transfer of data contained in registers $K_i$ and $S_i$ into channel register K and tuning register S respectively. The instruction is carried out after one of the numbered keys (0–9) is pressed by performing the equation 3 calculations and tuning into a station corresponding to channel number $K_i$ with tuning correction $S_i$.

Besides the two characters indicating the channel number, the display also shows the number of the key pressed and a symbol (I) indicating the operating mode in progress.

This type of tuning, performed by scanning the memory cells, will be referred to as "indirect" and corresponds to the selection of one of the 10 preferred channels having information stored therefor in RAM 1 as we shall see later.

Key D provides for a direct loading programme wherein data from the keyboard is loaded into register K for direct transfer into this register of coded input data.

The instruction is carried out every time a numbered key is pressed. The selected channel is only tuned to after the tens and units have been pressed, in that order (zeroes must also be set) by performing the usual calculation on registers K, S, C and F. Besides the selected channel number, a symbol (d) is also displayed to show the operation mode, as in the previous case.

This type of tuning will be referred to as "direct" in that it enables immediate tuning of a station by keying in the corresponding television channel number of the said standard.

With both the operation modes described above, + or − manual tuning corrections can be made by repeatedly pressing the + or − keys.

When detected by the keyboard reading programme, every depression of a + or − key results in a one-unit increase (decrease) in the programme to be performed on the fine-tuning register; S, followed by the usual calculation programme.

Tuning is thus displaced in 250 KHz steps up to a maximum of ±4 MHz in consecutive steps. A tuning correction does not usually affect the operation mode in progress, (register MO) so that new stations can be tuned to later using the procedure previously under way.

With both these operation modes (direct and indirect), tuning information for the selected station can be stored in memory regardless of any tuning corrections made.

By pressing key M, data contained in registers K and S is loaded into registers $K_i$ and $S_i$ respectively. The instruction is carried out after pressing one of the numbered keys ($i=0-9$). The operation mode remains unaffected and no change is made to either output data (N, U, B) or data sent to the display system.

This operation enables data for up to 10 preferred stations to be stored which data can later be called up easily using the indirect method.

When pressed, key $R_1$ generates a coded input signal which causes all the data contained in $K_i$ and $S_i$ register pairs to be loaded automatically and sequentially into the corresponding K and S registers, followed by the usual calculation programme.

Operation is very similar to the indirect mode. Manual pressing of the numbered keys is replaced by automatically increasing one of the RX registers by 0 to 9. Scanning speed is determined by a timer register T programmed so as to provide a delay of roughly 2 seconds.

This operation mode will be referred to as "indirect search".

An additional feature, in this case, is that special data is inserted into switch register INT so that, when any of the numbered or +/− key is pressed, automatic scanning is stopped and the + and − keys are set to increase or decrease the content of register RX already used for automatic scanning. The functions of keys I, D, M, R2 and R3, on the other hand, remain unchanged and stop the search by modifying the operation mode and restoring the value of switch register INT.

In the case of indirect searching, it is therefore possible to initiate cycle scanning of the preferred stations contained in the memory, stop scanning when the required transmission appears and, if desired, scan forwards or backwards manually.

When pressed, key R2 generates a coded input signal which increases register K automatically, followed by the usual calculation programme.

Operation is similar to the direct mode (we shall call this "direct search") but, in this case, a first sequence of N numbers is generated automatically, corresponding to the channels which can be tuned into on the said standard, starting from the currently tuned channel and only over effective bands (2-4, 5-12, 21-69, etc.).

As in the case of indirect searching, it is possible to stop the automatic search and arrange for manual advance (appropriate code in INT). In this case, the selected scanning speed is roughly 1 second per channel, determined by programming register T.

According to the last operation mode, key R3 generates a coded input signal which causes an increase of fine-tuning register S up to a maximum value of 31. For each increase of S, a calculation programme is performed and, when the maximum value is reached, register K is increased (2-12, 21-69) when S restored to its initial value.

In this way, a second sequence of all the N numbers is generated and a complete scanning operation performed of all the receivable frequency bands in 250 KHz steps at a speed of 4 seconds per channel (programming of T).

In this case too, as in the previous ones, automatic scanning can be stopped and scanning continued manually (keys + and −) in which case, they have the same effect as a tuning correction.

This operation mode will be referred to as "continuous" or "non-standard-station" search.

After stopping any type of search, storage in memory is, of course, possible following the procedure described above.

A more detailed description will now be given of the different operation modes of one of the possible applications of the present circuit arrangement, using a microprocessor and with reference to the block diagrams showing the basic logic functions performed by the circuits.

Figure 3:
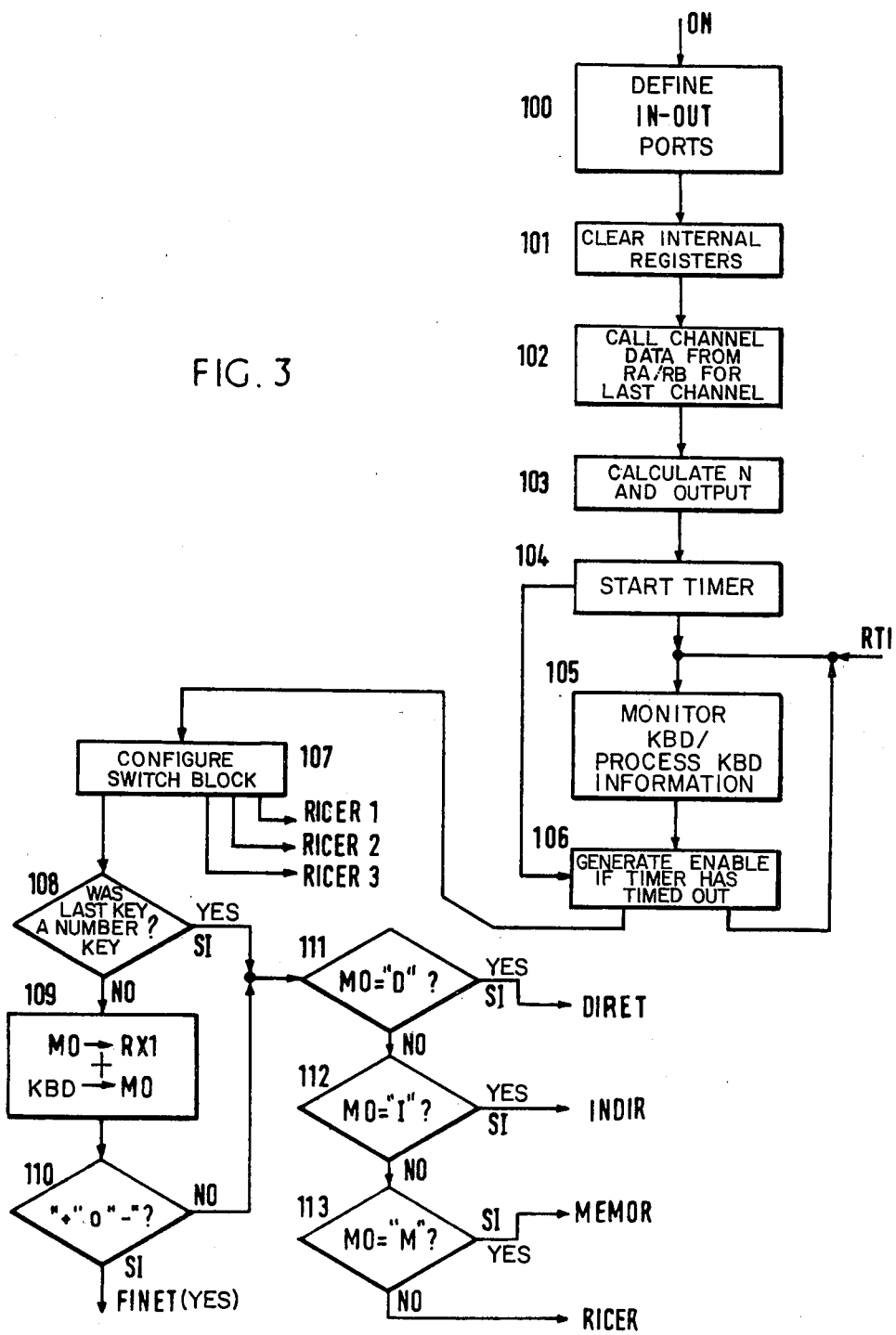
FIGS. 3 to 10 show block diagrams of the basic logic functions performed by the circuit arrangement covered by the present invention.

FIG. 3 shows one way of performing the initial logic functions, when the set is turned on, for checking the selection and performance of the operation modes mentioned above.

The ON signal is sent to block 100 which determines the input or output function of the programmable input-/output circuits (I/O ports) on processing unit 11, housed, for example, in a microprocessor structure.

To make this clearer, this definition establishes the connections shown in FIG. 1 from processing unit 11 to circuits 2, 4 and 9 to be outputs, while the connections from processing unit 11 to keyboard 10 are established as inputs.

A further function of block 100 is to select a direct output for switch circuit 107 towards block 108 when the set starts operating.

The output from block 100 subsequently activates blocks 101, 102 and 103 which allow automatic tuning, when the receiver is turned on, of the last channel tuned into before it was turned off, under the same tuning conditions selected previously.

In more detail, block 101 clears the internal registers used for subsequent calculations; block 102 calls up from non-volatile-memory cells RA and RB the channel number K and tuning correction S of the last station tuned into before the set was turned off and inserts them into registers K and S; finally, calculation and output block 103, which performs logic and arithmetical operations, starting from data K and S, receives signals B and U, calculates N using equation 3 and sends this data to outputs PA and PB of circuit 11 and number K to the display circuit, all according to a procedure described in more detail later on.

The output of calculation and output block 103 starts up a programmable timer block 104 which, in turn, supplies an input signal RT1 to block 105. This examines keyboard 10 and, if a key has been pressed, identifies it and is given the corresponding code which is stored in register RX and displayed.

The output signal from block 105 is sent to a second switch block, 106, which has 2 outputs, one connected to input RT1 and the other to the input of the first switch block 107.

A block 106 test input is connected to the second output of timer block 104, so that the switch is only set for block 107 after timer 104 supplies an end-of-count signal, that is, after a preset length of time, for example, ¼ second. Consequently, block 105 continues reading the keyboard waiting for input signals and block 107 and those following are only activated once every ¼ second. In this case, block 107, previously set by block 100, supplies a signal to block 108 which ascertains whether the last key pressed was one of the numbered ones.

If the test indicated by block 108 is affirmative, the output SI (indicated yes) is sent to the enabling input of block 111 while NO output, as indicated by block 109 causes the data in register MO to be transferred to register RX1 and transfers the code of the last key pressed to register MO.

The output of block 109 activates block 110, which performs a last key test of a type described in conjunction with block 108, similar to which here ascertains whether the last key pressed was one of the + or − keys.

If the test associated with block 110 is affirmative in the manner indicated by the arrow annotated yes, output SI acts as FINET signal to the blocks described hereinafter while output NO is employed to enable block 111.

Blocks 111, 112 and 113 form a test chain for ascertaining whether memory register MO contains a code defining to direct/indirect operation mode or storage.

Outputs SI (yes) of these blocks supply appropriate DIRET, INDIR or MEMOR signals to blocks described later, while NO outputs from blocks 111 and 112 activate the block 113. A yes or SI output from block 113 produces a signal employed to define a storage operation while a NO output from block 113 supplies a RICER signal described hereinafter.

Operation in accordance with the flow diagram according to FIG. 3 therefore consists essentially in initiating the system when the receiver is turned on by returning to the last station tuned, reading the control keyboard and, finally, ascertaining the selected operation mode, according to a pre-established frequency, for initiating the tuning process.

Figure 4:
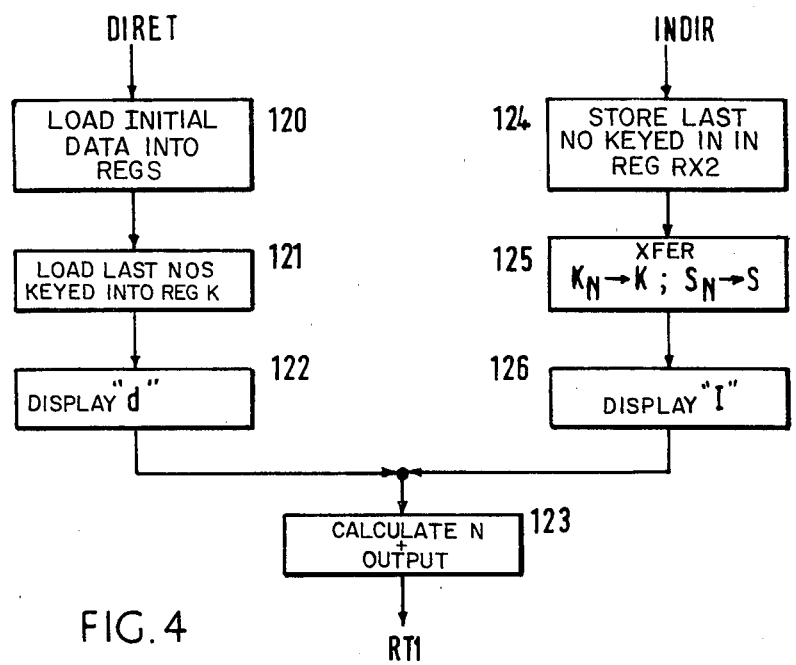

FIG. 4 shows one way of obtaining the operation modes previously described as "direct" and "indirect".

To do this, the DIRET signal shown in FIG. 3 enables, in sequence, block 120, which loads initial data, in our case, the number 16, into register S of FIG. 2, block 121, which loads the numbers of the last two numbers keyed into register K in BCD (binary-coded decimal) form and, finally, block 122, which sends the code corresponding to letter "d", indicating the direct operation mode, to the display circuit. The INDIR signal, on the other hand, activates, in sequence, blocks 124, 125 and 126. These cause storage of the number code of the last number keyed in register RX2 and send it to the display (block 124), transfer to registers K and S the data contained in registers $K_N$ and $S_N$ (125) identified by the content of the said register RX2 and, finally, send the code of the letter "I" indicating indirect operation mode to the display circuit.

Both the outputs of blocks 122 and 126 are connected to the input of calculation and output block 123 which performs the same functions as block 103 and supplies an output signal RT1 to block 105.

Figure 5:
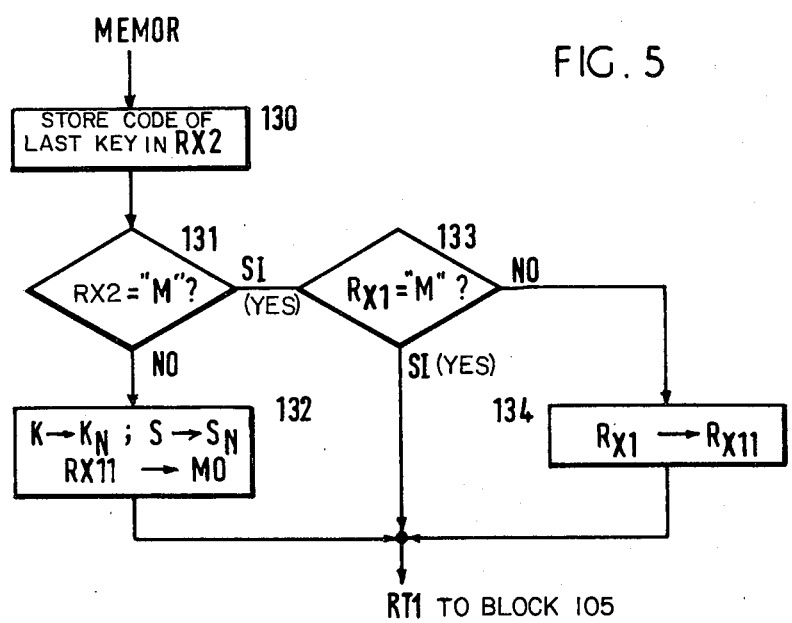

FIG. 5 shows one way of storing data concerning a tuned channel in memory.

The MEMOR signal in FIG. 3 enables, in sequence, block 130, which stores the code of the last key pressed in register RX2, and block 131, which ascertains whether the said key is the storage key M.

If the last key code is not M as indicated by the arrow annotated NO, storage block 132 is enabled which causes the contents of registers K, S and RX11 to be stored in registers $K_N$, $S_N$ and MO respectively. If the last key code was M as indicated by the arrow annotated yes, output SI enables block 133 which tests whether the content of register $R_{X1}$ corresponds to the M key code. If the contents of $R_{X1}$ does not equal M, storage block 134 is activated in the manner indicated by the arrow annotated NO which causes the content of register $R_{X1}$ to be stored in register $R_{X11}$. If the test indicated by block 133 is affirmative as indicated by the arrow SI (yes) or an output is provided by blocks 132 and 134, a supply signal RT1 is provided to block 105.

In other words, in the case of a switch input from a different operation mode to "storage" (131=SI, 133=NO), the previous operation mode in $R_{X11}$ is presented in the manner indicated in FIG. 5. Similarly, as indicated in FIG. 5, if a number key is pressed (131=NO), the data relative to the currently tuned signal (channel K, tuning S) is stored in the register pair $K_N$ and $S_N$ identified by the number of the key pressed and a return to the previous operation mode ($R_{X11} \rightarrow MO$) is initiated.

Figure 6:
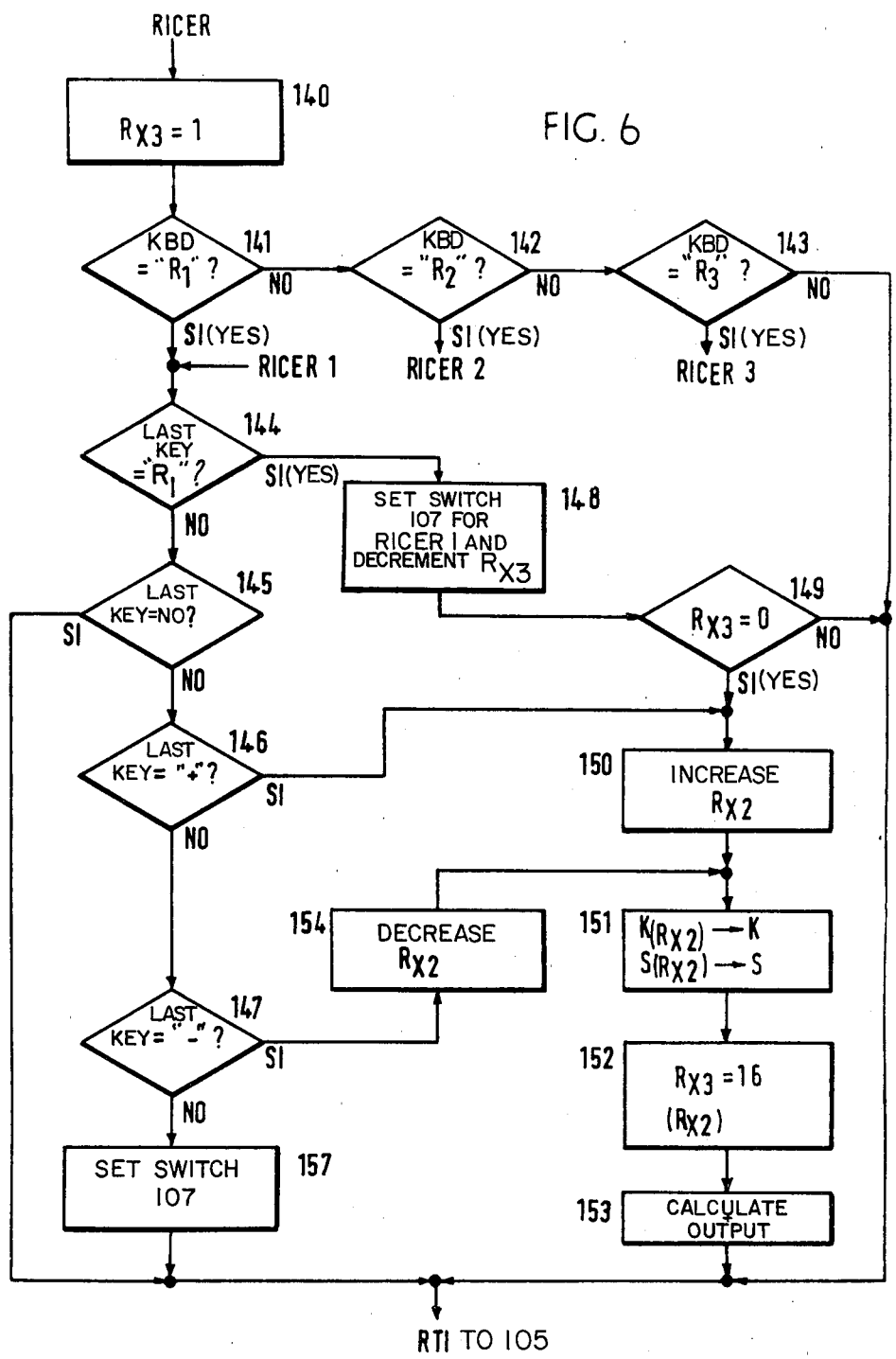

FIG. 6 shows one way of performing a station search, in particular, selection of one of the search modes and describes in more detail the technique for performing the search operation previously referred to as "indirect".

The RICER signal generated in FIG. 3 is employed in the manner indicated by block 140 for the purpose of assigning an initial value of 1 to the content of delay register $R_{X3}$. Thereafter, as indicated by blocks 141, 142 and 143, the last key pressed is identified as to whether or not one of keys $R_1$, $R_2$ or $R_3$ was depressed.

More particularly, an affirmative (yes) output from any of the tests indicated by blocks 141, 142 and 143, as indicated by outputs SI of blocks 141, 142 and 143, will supply RICER 1, RICER 2, and RICER 3 signals respectively in response to one of the keys $R_1$, $R_2$ or $R_3$ being pressed. Outputs annotated NO of blocks 141 and 142 will cause the tests associated with the following block to be initiated while associated with a negative result of the test associated with block 143 will cause a signal RT1 to be applied in the manner indicated to FIG. 3 at the location of block 105.

The RICER 1 signal activates block 144 which, together with blocks 145, 146 and 147, forms another chain for identifying the last key pressed.

More particularly, blocks 144, 145, 146 and 147 serve to ascertain whether the said key corresponds to key R1, a number key, a "+" key or a "−" key, respectively. A negative output from one of the tests associated with blocks 144, 145 and 146 activate the following block in the sequence or chain of tests indicated.

Conversely, an affirmative result from the test indicated by block 144 as indicated by the arrow annotated SI (yes) results in a setting of switch block 107 for RICER 1 and decreases by one unit the content of delay register $R_{X3}$ in the manner indicated by block 148.

Thereafter, as indicated by the block 149, a test is conducted which ascertains whether the content of register $R_{X3}$ equals 0. If the results of the test conducted is negative as indicated by the arrow annotated NO, the signal RT1 is supplied to block 105. An affirmative result as indicated by the output SI causes a decimal increase in the content of register $R_{X2}$ in the manner indicated by block 150. Thereafter, the sequence of steps associated with blocks 151-153 occur as follows:

The content of registers $K_N$ and $S_N$, identified by register $R_{X2}$, is transferred to registers K and S respectively in the manner indicated by block 151;

An initial value of 16 is assigned to the content of the delay register and the letter "r" (search) code and the content of register $R_{X2}$ is sent to the display circuits in the manner indicated by the block 152;

Thereafter N is calculated and an RT1 signal is supplied to block 105 in the manner indicated by block 153. If the test for the content of register $R_{X3}$ being zero indicated by block 149 is negative or the test for the last key being a number indicated by block 145 is affirmative as indicated by the arrow annotated SI, a signal RT1 is also supplied to block 105.

When the test indicated by block 146 is affirmative, the sequence of steps associated with blocks 150-153, as aforesaid is repeated. Similarly, if the test indicated by block 147 is affirmative, a decimal decrease to the content of register $R_{X2}$ is initiated as indicated by the block 154 and thereafter the sequence of steps associated with blocks 151-153 occurs as indicated in the manner aforesaid. Finally, if the test for the condition of the last key associated with block 147 is negative in the manner indicated by the arrow annotated NO, switch 107 is set with its output towards block 108 in the manner indicated by block 157 and signal RT1 is thereafter applied to block 105.

Operation in accordance with the flow diagram of FIG. 6 can be summed up as follows:

The type of search is identified in the manner indicated by blocks 141-143. If the indirect search (R1) control has been activated, an automatic search (response SI) is initiated in the manner indicated by block 144 and blocks 148, 149 and 150 in that register $R_{X2}$ is advanced automatically, after a delay period determined by register $R_{X3}$, scanning in sequence all the stations previously stored in the memory locations.

If a number key is pressed, the automatic search is stopped (144=NO, 155=SI (yes)) and the investigation is continued every ¼ second (switch 107 towards RICER 1).

If one of the accessory + or − keys is pressed, a manual cycle scan is performed whereas, if one of the auxiliary operation-mode-selection keys is pressed, switch-back to selected-mode conditions (reset block 157) occurs.

Figure 7:
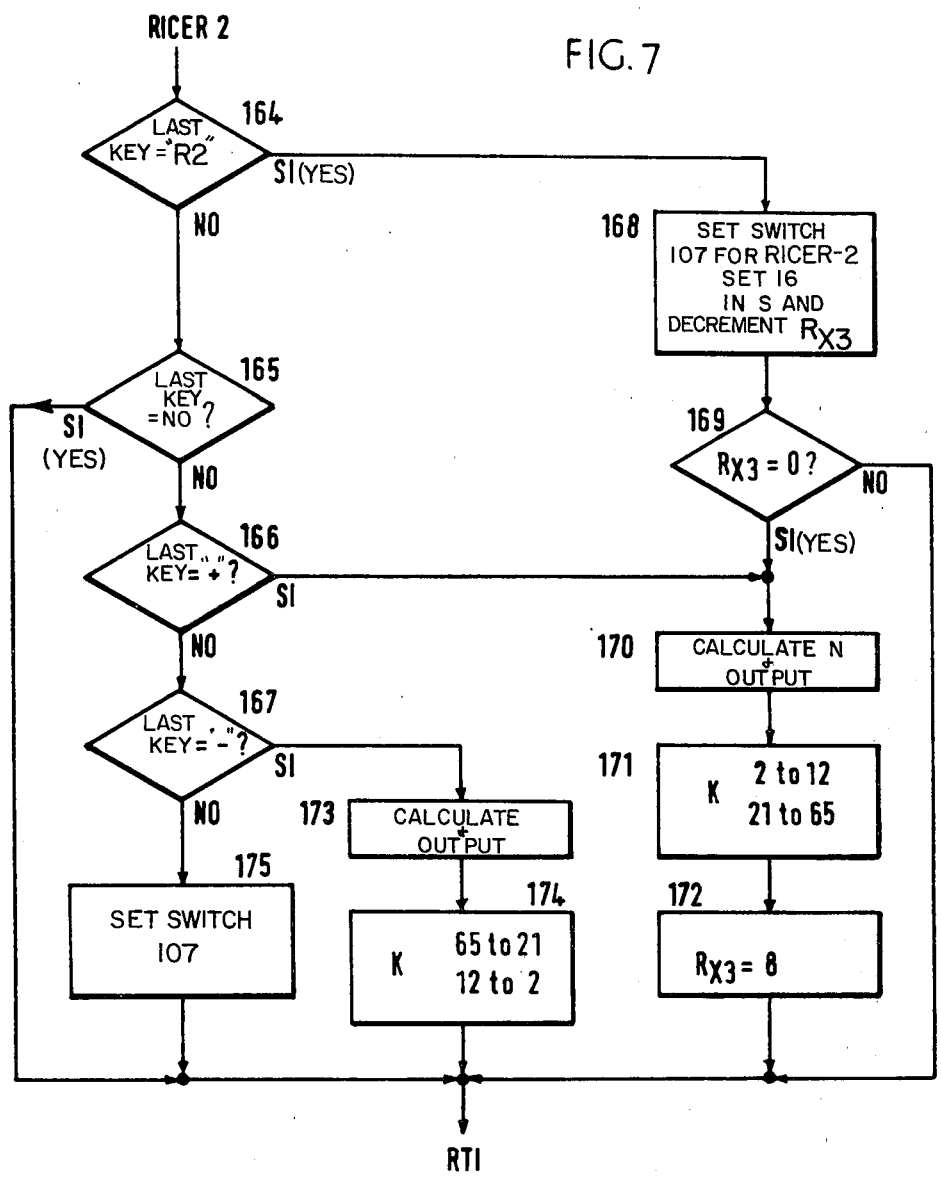

FIG. 7 shows one way in which the instant invention tunes stations using the procedure previously referred to as "direct".

The flow diagram illustrated in FIG. 7 is very similar to that of the RICER 1 blocks so that only the differing features will be described in detail.

Upon entry into the routine at the location indicated RICER 2, the system tests to ascertain which type of key was last pressed in the manner indicated by the blocks 164–167. These tests are the same as were previously discussed in conjunction with blocks 144–147 in FIG. 6.

If the test associated with block 164 (R2 key pressed) is affirmative in the manner indicated by the arrow annotated SI or yes, switch 107 is set in the manner indicated by block 168 with its output towards RICER 2, an initial value of 16 is assigned to the content of register S, and the content of delay register $R_{X3}$ is decreased. Thereafter register $R_{X3}$ is tested in the manner indicated by block 169 to ascertain whether the content of the said register is 0.

If an affirmative result is obtained as indicated by the arrow annotated SI or yes, the usual calculation is performed in the manner indicated by block 170, which performs similar functions to that already described in conjunction with block 123. Thereafter, a decimal increase of the contents of register K from 2 to 12, then from 21 to 65, etc. is performed in the manner indicated by block 171 and, finally, a value of 8 is assigned to register $R_{X3}$ in a manner typical of this type of search, as indicated by block 172. Thereafter, signal RT1 is supplied to block 105 as is also the case if a negative result is obtained from the test associated with block 169 or an affirmative result is obtained from the test indicated for block 165 (number key).

If the test indicated by block 166 (+ key) is affirmative, the steps associated with blocks 170-172 are initiated while a negative result causes testing in the manner indicated by block 167. If an affirmative result is obtained from the test associated wih block 167, the calculation associated with block 173 is initiated. However, if a negative result obtains, switch 107 is set towards block 108 in the manner indicated by block 175 and signal RT1 is output.

After the calculation associated with block 173 is performed, a decimal decrease of register K within the 65-21 and 12-2 range is performed in the manner indicated by block 174 and the signal RT1 is output. The operation according to the flow diagram of FIG. 7 is very similar to that shown in FIG. 6 as regards logic decisions and the sequence of operations. The search is initiated automatically, stopped by pressing any key other than R2 and, if the said key is not an operation-mode-selection key, the set prepares to advance manually in both search directions, though, in this case, between receivable standard channels.

Figure 8:
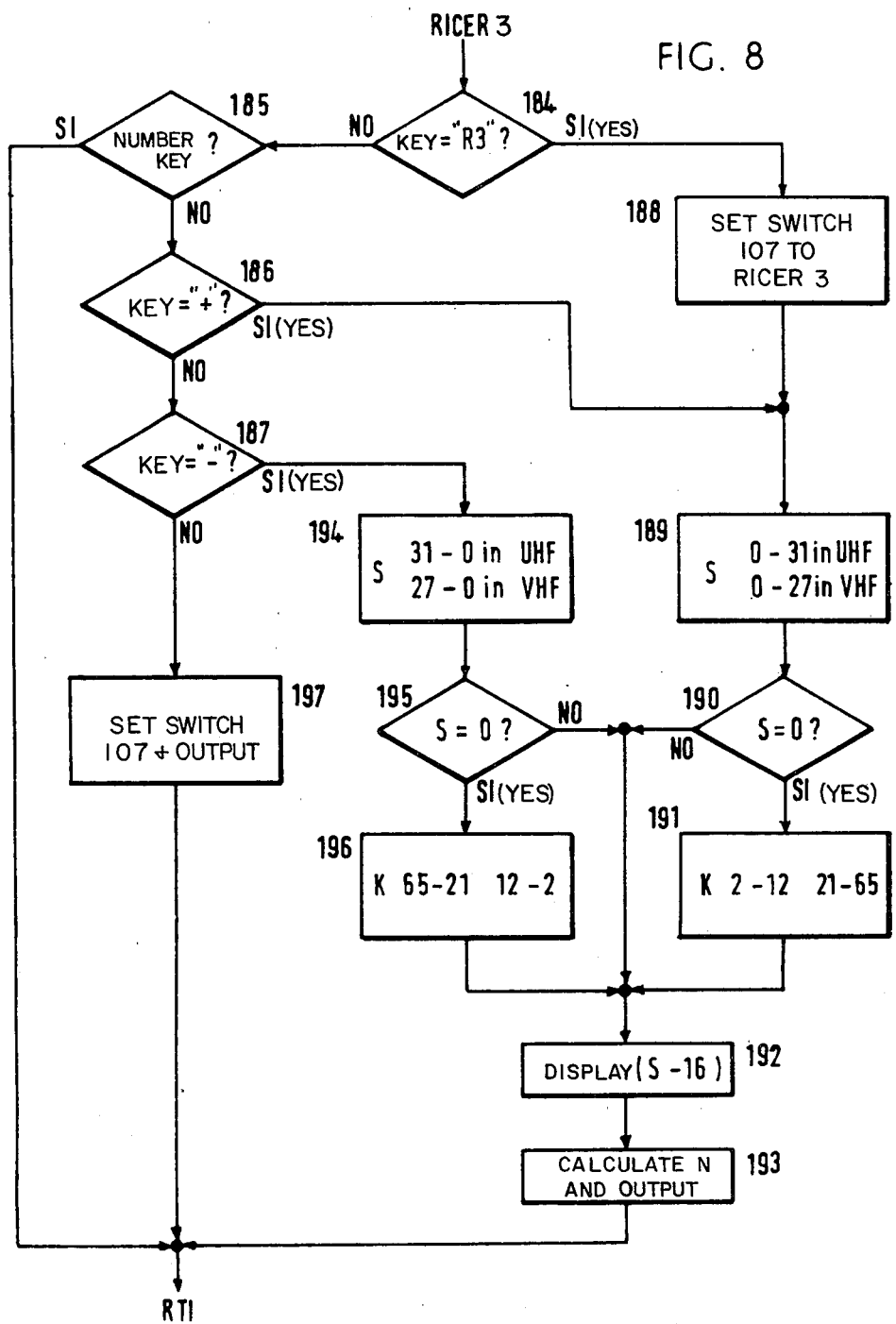

FIG. 8 shows one way of tuning into stations using the search procedure previously referred to as "continuous".

Here too, the arrangement of the flow about is very similar to that of FIGS. 7 and 6 so the description will be limited to detailing the differences.

When the flow about illustrated in FIG. 8 is entered at the location annotated RICER 3, the program initially acts to ascertain the type of key last pressed in the manner indicated by the blocks 184–187.

Thus, as indicated by block 184, the program first tests for the presence of the R3 key (R3 key pressed). If the R3 key was depressed, as indicated by the arrow annotated SI (yes), the output of switch 107 is set towards RICER 3 in the manner indicated by block 188. Thereafter, as indicated by block 189, the content of register S is increased by one unit from 0-31 for channels on the UHF band or from 0-27 for the VHF band channels.

The program then tests in the manner indicated by block 190 to ascertain whether the content of register S is 0. If register S is 0, as indicated by output SI, a decimal increase to the content of register K (in exactly the same way as block 171 in FIG. 7) is performed in the manner indicated by block 191 and displayed in the manner indicated by block 192 which informs the display circuits of the move away from standard channel frequency (S-16). Thereafter, N is calculated in the manner indicated by block 193 in the identical manner discussed in association with block 123. The signal RT1 then outputs as indicated and this also occurs if the test conducted by block 185 (number key) is affirmative.

If the test for the number key indicated by block 185 is negative, the program then tests for the presence of the plus key as indicated by block 186. If the test associated with block 186 (+ key) is affirmative, as indicated by the SI output, the loop is reentered at the location of block 189. If a negative result obtains the program test for the presence of the minus key, as indicated by block 187 and an affirmative result obtains, as indicated by the SI output of block 187 (− key), the content of register S is decreased between 31-0 and 27-0 for UHF and VHF respectively in the manner indicated by block 194. Thereafter, the program ascertains whether the content of register S is 0 in the manner indicated by block 195.

If S=0, as indicated by the SI output of block 195, a decimal decrease to the content of register K between 65-21 and 12-2 is performed as indicated by the block 196 and the display step associated with block 192 is initiated. This also occurs if the test associated with blocks 190 and 195 is negative. If the result of the test associated with block 187 is negative, switch 107 is set with its output towards block 108 and a signal RT1 is output.

In this case too, operation is very similar to that of the diagrams of FIG. 6 and FIG. 7 as regards the logical decision and operation sequence. Pressing key R3 at the keyboard initiates an automatic search (block 188, etc.) which is stopped by pressing one of the remaining keys which either provides for a different operation mode (output from block 197) or for manual search in both directions (SI output of blocks 186 and 187).

Blocks 189 and 194, characteristic of this type of search, perform a scanning operation of the channel in 250 KHz steps at the end of which blocks 191 and 196, which are typical direct search blocks, are activated for scanning all the standard channels.

In this case, with a step of 250 KHz, manual scanning corresponds to a fine tuning correction of a station but with no excursion limit. With this type of search, it is therefore possible to locate and tune manually into even a non-standard station and, of course, store it, if required, following the procedure already described.

Figure 9:
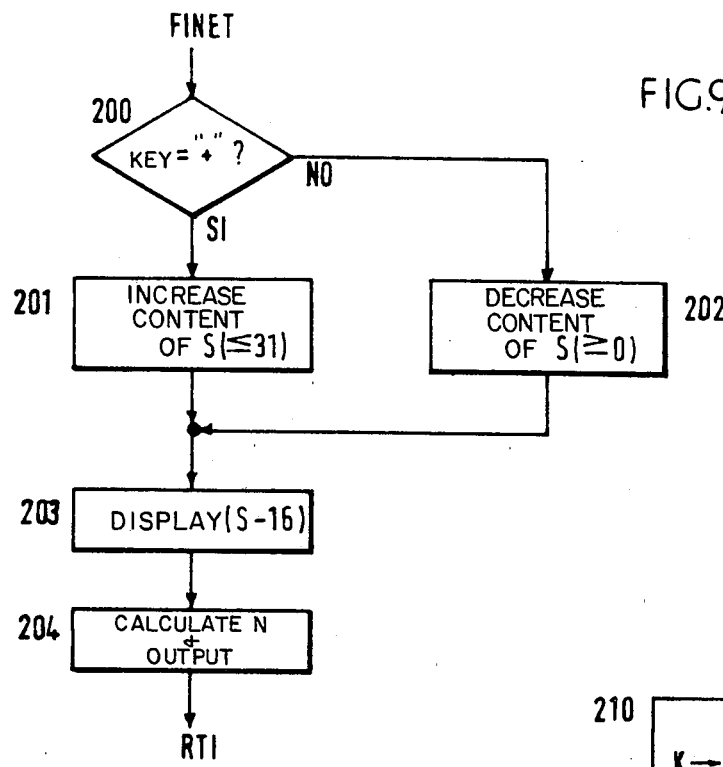

FIG. 9 shows one way of performing a tuning correction to a station tuned into using any one of the procedures already described.

This routine is entered at the location indicated by FINET. Once entered, the program tests in the manner indicated by block 200 to ascertain whether the key pressed is the + key. If the test associatd with block 200 is affirmative, as indicated by the SI outut, the content of register S is increased up to a maximum of 31 as indicated by block 201 while a negative output (− key by elimination) causes a decrease in the content of the register S to a minimum of 0 in the manner indicated by block 202.

After either of the steps associated with blocks 201 and 202, an out-of-tune indication (S-16) as compared with the nominal value of the standard channel is displayed in the manner indicated by the block 203. Thereafter, the value of N is calculated and output in the manner indicated by block 204, identical to 123, and, finally, signal RT1 is provided in the manner indicated.

Operation of this routine is such that, by pressing the + or − key repeatedly, tuning shifts are possible in steps of 250 KHz, in either direction, with indication of the number of steps made. It is possible, of course, to switch to any one of the other operation modes by pressing the appropriate key, e.g. store the optimum tuning condition obtained.

Figure 10:
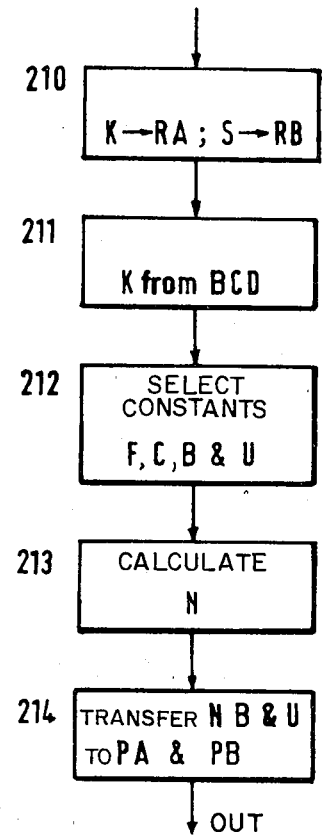

FIG. 10 shows one way of implementing the functions performed in the calculation and output step indicated by block numbers 103, 123, 153, 170, 173, 193 and 204 in the preceding Figures.

In response to entering this subroutine as indicated by block 210, the contents of register K are stored. The data contained in register K relates to the television standard number of the channel to be tuned into. This information is sent to the display circuit as the data contained in S is stored in Register RB.

Thereafter, as indicated by the block 211, the data contained in register K is converted from BCD (binary coded decimal) to pure binary form to simplify processing. Upon the completion of this conversion, as indicated by block 212 and depending on the number obtained, the values of constants F, C, U and B, according to Table 1 are selected and loaded into the appropriate registers.

According to the operation mode described above, each time the FIG. 10 subroutine is activated, band-switch signals U and B are supplied to the tuner, depending on whether the selected channel belongs to Band I, III or UHF, and a code for obtaining division ratio N is applied to programmable divider circuit 4. Also, the number of the channel thus tuned into is displayed by display 9 and the data relative to the channel number K and tuning S are stored in registers RA and RB of the non-volatile memory. This data is sufficient for the subroutine stored in FIG. 10 to identify an entire turning condition.

When the television set is turned off or following a temporary power cut, it is possible, as described with reference to FIG. 3, for the previous tuning condition to be restored automatically when the set is turned on again. It was said that the sequence of basic operations to be performed by the processing unit, that is, the programme, is contained in code in the read-only memory (ROM) portion of memory 12.

For a better understanding of the present invention, a description will now be given of this memory circuit, used in conjunction with a microprocessor consisting of a central processing unit MCS 6502 and two peripheral units MCS 6530/002 and MCS 6530/003.

The memory circuit in question consists essentially of a connection matrix with a 1000×8 format, input and address-decoding circuits and output buffer circuits.

Each individual connection can be either open or closed and represents permanent basic data (bit) of 1 or 0. Each group of 8 connections, addressed by one of the 1000 address-input combinations, represents a basic 8-bit instruction or word (byte). By applying all the possible address combinations to the input, all the data contained in the ROM can be obtained at the output in word form.

The connection matrix can be made either by means of a masking process when the integrated circuit (ROM) is made or by means of a connection-merging process (PROM: programmable read-only memory). In the case of the circuit described in the present invention, these connections are listed in the Tables on the following pages which, for brevity, apply to a receiver for exclusive reception of channels in the UHF range. The left-hand columns show the addresses in hexadecimal notation and the right-hand ones the connection states of the corresponding memory cell. The number 1 indicates an open connection with a corresponding logic 1 at the output whereas 0 indicates a closed connection.

As each memory cell consists of 8 connections, it follows that it can be represented by a combination of 8 binary figures. For the sake of brevity, hexadecimal notation was used on the following Tables so that, for example, the EA notation for base 16, which corresponds to 11101100 for base 2, indicates that the corresponding memory cell has connections 1, 2, 3, 5 and 6 open and the remaining ones closed.

TABLE 2

| ADDRESS | CODE | ADDRESS | CODE |
|---|---|---|---|
| 0400 | A9 | 0415 | OC |
| 0401 | 7F | 0416 | 85 |
| 0402 | 8D | 0417 | FA |
| 0403 | O1 | 0418 | 20 |
| 0404 | 17 | 0419 | E8 |
| 0405 | A9 | 041A | O5 |
| 0406 | 1F | 041B | 4C |
| 0407 | 8D | 041C | 4F |
| 0408 | O3 | 041D | 1C |
| 0409 | 17 | 041E | A5 |
| 040A | A9 | 041F | FA |
| 040B | 1E | 0420 | 29 |
| 040C | 8D | 0421 | OF |
| 040D | FA | 0422 | 38 |

TABLE 2-continued

| ADDRESS | CODE | ADDRESS | CODE |
|---|---|---|---|
| 040E | 17 | 0423 | E9 |
| 040F | A9 | 0424 | OA |
| 0410 | O4 | 0425 | 30 |
| 0411 | 8D | 0426 | 12 |
| 0412 | FB | 0427 | A5 |
| 0413 | 17 | 0428 | 24 |
| 0414 | A9 | 0429 | 85 |
| 042A | 25 | 0440 | FA |
| 042B | A5 | 0441 | 85 |
| 042C | FA | 0442 | 29 |
| 042D | 29 | 0443 | 20 |
| 042E | OF | 0444 | E8 |
| 042F | 85 | 0445 | O5 |
| 0430 | 19 | 0446 | A5 |
| 0431 | 38 | 0447 | 24 |
| 0432 | E9 | 0448 | 38 |
| 0433 | OC | 0449 | E9 |
| 0434 | 10 | 044A | OC |
| 0435 | OD | 044B | 10 |
| 0436 | 4C | 044C | O1 |
| 0437 | CF | 044D | 40 |
| 0438 | O5 | 044E | AA |
| 0439 | A5 | 044F | DO |
| 043A | 24 | 0450 | O3 |
| 043B | 49 | 0451 | 4C |
| 043C | OE | 0452 | C1 |
| 043D | FO | 0453 | 05 |
| 043E | O4 | 0454 | CA |
| 043F | A5 | 0455 | DO |
| 0456 | O3 | 045B | DO |
| 0457 | 4C | 045C | O3 |
| 0458 | B1 | 045D | 4C |
| 0459 | O5 | 045E | 83 |
| 045A | CA | 045F | O5 |

TABLE 3

| ADDRESS | CODE | ADDRESS | CODE |
|---|---|---|---|
| 0460 | A9 | 046D | 3F |
| 0461 | O1 | 046E | FO |
| 0462 | 85 | 046F | 60 |
| 0463 | 21 | 0470 | A5 |
| 0464 | A5 | 0471 | FA |
| 0465 | FA | 0472 | 49 |
| 0466 | 49 | 0473 | 1F |
| 0467 | 2F | 0474 | FO |
| 0468 | FO | 0475 | O1 |
| 0469 | 69 | 0476 | 40 |
| 046A | A5 | 0477 | 20 |
| 046B | FA | 0478 | E8 |
| 046C | 49 | 0479 | O5 |
| 047A | A5 | 0490 | 18 |
| 047B | FA | 0491 | F8 |
| 047C | 49 | 0492 | A5 |
| 047D | 1F | 0493 | 20 |
| 047E | DO | 0494 | 69 |
| 047F | 20 | 0495 | O1 |
| 0480 | A9 | 0496 | 85 |
| 0481 | 77 | 0497 | 20 |
| 0482 | 8D | 0498 | 20 |
| 0483 | FA | 0499 | O1 |
| 0484 | 17 | 049A | O6 |
| 0485 | A9 | 049B | A9 |
| 0486 | O4 | 049C | 10 |
| 0487 | 8D | 049D | 85 |
| 0488 | FB | 049E | 21 |
| 0489 | 17 | 049F | 40 |
| 048A | C6 | 04A0 | A5 |
| 048B | 21 | 04A1 | FA |
| 048C | A5 | 04A2 | 29 |
| 048D | 21 | 04A3 | OF |
| 048E | DO | 04A4 | 85 |
| 048F | OF | 04A5 | 26 |
| 04A6 | 38 | 04BC | O1 |
| 04A7 | E9 | 04BD | 4C |
| 04A8 | OA | 04BE | C6 |
| 04A9 | 30 | 04BD | O4 |
| 04AA | OB | 04C0 | 18 |
| 04AB | FO | 04C1 | F8 |

TABLE 3-continued

| ADDRESS | CODE | ADDRESS | CODE |
|---|---|---|---|
| 04AC | 13 | 04C2 | A5 |
| 04AD | A5 | 04C3 | 20 |
| 04AE | 26 | 04C4 | 69 |
| 04AF | 49 | 04C5 | O1 |
| 04B0 | OB | 04C6 | O9 |
| 04B1 | F0 | 04C7 | F0 |
| 04B2 | O4 | 04C8 | 85 |
| 04B3 | 20 | 04C9 | 20 |
| 04B4 | EE | 04CA | 85 |
| 04B5 | O5 | 04CB | FA |
| 04B6 | 40 | 04CC | 20 |
| 04B7 | 38 | 04CD | O1 |
| 04B8 | F8 | 04CE | O6 |
| 04B9 | A5 | 04CF | 40 |
| 04BA | 20 | 04D0 | 4C |
| 04BB | E9 | 04D1 | 3B |
|  |  | 04D2 | O5 |

TABLE 4

| ADDRESS | CODE | ADDRESS | CODE |
|---|---|---|---|
| 04D3 | A5 | 04E5 | D3 |
| 04D4 | 14 | 04E6 | 8D |
| 04D5 | 85 | 04E7 | FA |
| 04D6 | FB | 04E8 | 17 |
| 04D7 | 20 | 04E9 | A9 |
| 04D8 | E8 | 04EA | O4 |
| 04D9 | O5 | 04EB | 8D |
| 04DA | A5 | 04EC | FB |
| 04DB | FA | 04ED | 17 |
| 04DC | 49 | 04EE | C6 |
| 04DE | 2F | 04EF | 21 |
| 04DF | D0 | 04F0 | A5 |
| 04E0 | 2C | 04F1 | 21 |
| 04E1 | A9 | 04F2 | D0 |
| 04E2 | 18 | 04F3 | 17 |
| 04E3 | 85 | 04F4 | 18 |
| 04E4 | 15 | 04F5 | F8 |
|  | A9 |  |  |
| 04F6 | A5 | 050C | A5 |
| 04F7 | 14 | 050D | FA |
| 04F8 | 69 | 050E | 29 |
| 04F9 | O1 | 050F | OF |
| 04FA | 85 | 0510 | 85 |
| 04FB | 14 | 0511 | 26 |
| 04FC | 49 | 0512 | 38 |
| 04FD | 66 | 0513 | E9 |
| 04FE | D0 | 0514 | OC |
| 04FF | O4 | 0515 | 10 |
| 0500 | A9 | 0516 | 20 |
| 0501 | 21 | 0517 | 69 |
| 0502 | 85 | 0518 | O2 |
| 0503 | 14 | 0519 | 30 |
| 0504 | 20 | 051A | F0 |
| 0505 | 14 | 051B | AA |
| 0506 | O6 | 051C | A9 |
| 0507 | A9 | 051D | F2 |
| 0508 | 08 | 051E | 85 |
| 0509 | 85 | 051F | FA |
| 050A | 21 | 0520 | 8A |
| 050B | 40 | 0521 | F0 |
| 0522 | D1 | 052F | A9 |
| 0523 | 38 | 0530 | 65 |
| 0524 | F8 | 0531 | 85 |
| 0525 | A5 | 0532 | 14 |
| 0526 | 14 | 0533 | 20 |
| 0527 | E9 | 0534 | 14 |
| 0528 | O1 | 0535 | O6 |
| 0529 | 85 | 0536 | 40 |
| 052A | 14 | 0537 | 20 |
| 052B | 49 | 0538 | EE |
| 052C | 20 | 0539 | O5 |
| 052D | D0 | 053A | 40 |
| 052E | O4 |  |  |

TABLE 5

| ADDRESS | CODE | ADDRESS | CODE |
|---|---|---|---|
| 053B | A5 | 0540 | B8 |
| 053C | 14 | 0541 | O5 |
| 053D | 85 | 0542 | A5 |
| 053E | FB | 0543 | FA |
| 053F | 20 | 0544 | 49 |
| 0545 | 3F | 055B | 14 |
| 0546 | D0 | 055C | O6 |
| 0547 | 16 | 055D | 40 |
| 0548 | A9 | 055E | A5 |
| 0549 | 3B | 055F | FA |
| 054A | 8D | 0560 | 29 |
| 054B | FA | 0561 | OF |
| 054C | 17 | 0562 | 85 |
| 054D | A9 | 0563 | 26 |
| 054E | O5 | 0564 | 38 |
| 054F | 8D | 0565 | E9 |
| 0550 | FB | 0566 | OC |
| 0551 | 17 | 0567 | 10 |
| 0552 | E6 | 0568 | CE |
| 0553 | 15 | 0569 | 69 |
| 0554 | A5 | 056A | O2 |
| 0555 | 15 | 056B | 30 |
| 0556 | 29 | 056C | F0 |
| 0557 | 1F | 056D | AA |
| 0558 | F0 | 056E | A9 |
| 0559 | 9A | 056F | F3 |
| 055A | 20 | 0570 | 85 |
| 0571 | FA | 057A | 1F |
| 0572 | 8A | 057B | 49 |
| 0573 | F0 | 057C | 1F |
| 0574 | DD | 057D | F0 |
| 0575 | C6 | 057E | A4 |
| 0576 | 15 | 057F | 20 |
| 0577 | A5 | 0580 | 14 |
| 0578 | 15 | 0581 | O6 |
| 0579 | 29 | 0582 | 40 |

TABLE 6

| ADDRESS | CODE | ADDRESS | CODE |
|---|---|---|---|
| 0583 | A5 | 058C | A5 |
| 0584 | FA | 058D | 14 |
| 0585 | 29 | 058E | 95 |
| 0586 | OF | 058F | OO |
| 0587 | AA | 0590 | A5 |
| 0588 | 49 | 0591 | 15 |
| 0589 | OE | 0592 | 95 |
| 058A | F0 | 0593 | OA |
| 058B | 1A | 0594 | A5 |
| 0595 | 2A | 05A3 | 85 |
| 0596 | 85 | 05A4 | FA |
| 0597 | 24 | 05A5 | 40 |
| 0598 | 38 | 05A6 | A5 |
| 0599 | F9 | 05A7 | 25 |
| 059A | OC | 05A8 | 49 |
| 059B | 10 | 05A9 | OE |
| 059C | O4 | 05AA | F0 |
| 059D | A5 | 05AB | O4 |
| 059E | 14 | 05AC | A5 |
| 059F | 85 | 05AD | 25 |
| 05A0 | FB | 05AE | 85 |
| 05A1 | A5 | 05AF | 20 |
| 05A2 | 29 | 05B0 | 40 |

TABLE 7

| ADDRESS | CODE | ADDRESS | CODE |
|---|---|---|---|
| 05B1 | A9 | 05B5 | A5 |
| 05B2 | 18 | 05B6 | FA |
| 05B3 | 85 | 05B7 | 85 |
| 05B4 | 15 | 05B8 | 14 |
| 05B9 | A9 | 05C4 | 20 |
| 05BA | OD | 05C5 | 20 |
| 05BB | 85 | 05C6 | O1 |
| 05BC | FB | 05C7 | O6 |
| 05BD | 20 | 05C8 | 8A |
| 05BE | 14 | 05C9 | 18 |
| 05BF | O6 | 05CA | 69 |

TABLE 7-continued

| ADDRESS | CODE | ADDRESS | CODE |
|---|---|---|---|
| 05C0 | 40 | 05CB | C0 |
| 05C1 | A5 | 05CC | 85 |
| 05C2 | FA | 05CD | FA |
| 05C3 | 85 | 05CE | 40 |

TABLE 8

| ADDRESS | CODE | ADDRESS | CODE |
|---|---|---|---|
| 05CF | A5 | 05D6 | 85 |
| 05D0 | FA | 05D7 | FA |
| 05D1 | 29 | 05D8 | A5 |
| 05D2 | 01 | 05D9 | 14 |
| 05D3 | AA | 05DA | 85 |
| 05D4 | A9 | 05DB | FB |
| 05D5 | 00 | 05DC | 20 |
| 05DD | E8 | 05E3 | 52 |
| 05DE | 05 | 05E4 | 05 |
| 05DF | 8A | 05E5 | 4C |
| 05E0 | D0 | 05E6 | 75 |
| 05E1 | 03 | 05E7 | 05 |
| 05E2 | 4C | | |

TABLE 9

| ADDRESS | CODE | ADDRESS | CODE |
|---|---|---|---|
| 05E8 | A9 | 05F4 | 04 |
| 05E9 | 80 | 05F5 | 8D |
| 05EA | 8D | 05F6 | FB |
| 05EB | 0F | 05F7 | 17 |
| 05EC | 17 | 05F8 | A9 |
| 05ED | 60 | 05F9 | 01 |
| 05EE | A9 | 05FA | 85 |
| 05EF | 1E | 05FB | 21 |
| 05F0 | 8D | 05FC | A5 |
| 05F1 | FA | 05FD | 26 |
| 05F2 | 17 | 05FE | 85 |
| 05F3 | A9 | 05FF | 24 |
| 0600 | 60 | 060A | 85 |
| 0601 | A5 | 060B | FB |
| 0602 | 20 | 060C | B5 |
| 0603 | 29 | 060D | 0A |
| 0604 | 0F | 060E | 85 |
| 0605 | AA | 060F | 15 |
| 0606 | B5 | 0610 | 20 |
| 0607 | 00 | 0611 | 14 |
| 0608 | 85 | 0612 | 06 |
| 0609 | 14 | 0613 | 60 |

TABLE 10

| ADDRESS | CODE | ADDRESS | CODE |
|---|---|---|---|
| 0614 | A9 | 061C | 25 |
| 0615 | 0F | 061D | 14 |
| 0616 | 25 | 061E | 4A |
| 0617 | 14 | 061F | 85 |
| 0618 | 85 | 0620 | 22 |
| 0619 | 23 | 0621 | 4A |
| 061A | A9 | 0622 | 4A |
| 061B | F0 | 0623 | D8 |
| 0624 | 65 | 062C | 17 |
| 0625 | 23 | 062D | A5 |
| 0626 | 65 | 062E | 15 |
| 0627 | 22 | 062F | 8D |
| 0628 | 69 | 0630 | 02 |
| 0629 | 2A | 0631 | 17 |
| 062A | 8D | 0632 | 60 |
| 062B | 00 | | |

The foregoing Tables 2-10 contain, in code, a possible basic-operation sequence for performing the operations shown in the block diagrams, using the microprocessor system described, as follows:

Table 2→Diagram FIG. 3 (initiation and operation-mode selection)
Table 3→Diagram FIG. 6 (search mode selection and indirect search)
Table 4→Diagram FIG. 7 (direct search)
Table 5→Diagram FIG. 8 (continuous search)
Table 6→Diagram FIG. 5 (storage)
Table 7→Diagram FIG. 4 (direct and indirect tuning)
Table 8→Diagram FIG. 9 (fine tuning)
Table 9→Diagr. FIGS. 3-9 (common service functions)
Table 10→Diagram FIG. 10 (calculation and output)

In other words, the foregoing Tables contain all the instructions needed for the microprocessor system to perform all the operations for tuning into UHF band television channels as described previously, excepting control key board reading and display circuit driving functions which are performed by the MCS 6530 components.

Notice how, in agreement with FIG. 2, the RAM 1, RAM 2 and ROM memory blocks are separate and start in response to addresses 0000, 0020 and 0400 respectively so as to enable different circuits to be used. In the example shown, the RAM 1 memory is a MNOS non-volatile type. Under certain circumstances, it may be beneficial to employ a CMOS low-consumption memory with a buffer battery.

In this way, the data relative to the stored channels can also be retained in the event of a power cut. What is more, this memory also includes registers RA and RB which means the last received station can be tuned into automatically when the receiver is turned on.

The advantages of the circuit arrangement according to the present invention will be clear from the description given.

Many variations are, of course, possible. For example, in the foregoing description, it was assumed a special 8-bit microprocessor system with a separate CPU and ROM was used. It is both possible and beneficial to use other types of microprocessor, e.g. with a number of internal RAM registers (usually 64), or the so-called monochip type which, besides the ROM memory, also includes an internal RAM memory and timing circuit. A 16-bit microprocessor can also be used.

Given the structure, according to the invention, other functions can easily be performed, such as a digital clock and time programming of stored channels, controlled by appropriate accessory keys.

It may also be beneficial to equip the receiver with a remote control, in which case, a control panel, similar to the one described, is used in conjunction with the portable transmitter part on the remote-control system. To avoid duplicate control panels, a further variant provides for a housing in the receiver cabinet, equipped with electric contacts in which to plug the said transmitter if the local control is required.

In the case of television receivers according to the present invention, it may prove useful, during certain stages of manufacture such as those relative to life and reliability, to set the receiver under test for one of the automatic search operations, preferably indirect, after stored the available channels, so as to maintain the receiver in the normal receiving condition, synchronized with a video signal but with different test pictures so as to avoid the so-called "print" effects on the kinescope.

The devices described in the present invention can also be used as automatic test instruments for checking, setting and measuring purposes, during the assembly of a signal receiving set.

I claim:

1. A circuit arrangement for tuning to one of a number of radioelectric signals receivable on a signal receiver set comprising:
   a controllable oscillator exhibiting a variable output frequency signal depending upon a binary number N;
   frequency divider means for receiving said output signal from said controllable oscillator and a sequence of coded signals representing said binary number N and producing a first output signal whose frequency depends upon said binary number N;
   means for producing a reference signal having a predetermined frequency in the form of a second output signal;
   comparator means for comparing said first and second output signals and producing a third signal for required tuning, said third signal being applied to said controllable oscillator for varying the output frequency thereof as a function of the binary number N;
   memory means having a plurality of storage locations for storing data relative to signals tuned in digital form;
   means for selectively generating coded input data; and
   processor means responsive to said coded input data for supplying a sequence of coded signals representing said binary member N to said frequency divider means, said processor means being selectively responsive to said coded input data to sequentially scan said storage locations of said memory means in automatic or manual, step-by-step modes and to supply said sequence of coded signals representing said binary number N both in direct response to said coded input data and in response to data provided by said memory means, said processor means being set in response to coded input data taking the form of a first coded input signal to generate a particular sequence of N numbers corresponding to the total number of receivable radioelectric signals according to a pre-established transmission standard and responsive to coded input data taking the form of a second coded input signal to advance the number N within said particular sequence by one increment.

2. The circuit arrangement according to claim 1, wherein said processor means is responsive to coded input data taking the form of a third coded input signal to generate said particular sequence of N numbers and, is responsive to coded input data taking the form of a fourth coded input signal to stop an automatic advance of said particular sequence as also produced by said third signal.

3. The circuit arrangement according to claim 2, wherein said fourth input signal also sets said processor means for generating said particular sequence of N numbers.

4. The circuit arrangement according to claim 1, wherein said processor means is set in response to coded input data taking the form of a third coded input signal to generate another sequence of N numbers for scanning the entire band of receivable radioelectric signals in increments smaller than those defined for the transmission of standard channels and is responsive to coded input data taking the form of a fourth coded input signal to advance said another sequence by one increment.

5. The circuit arrangement according to claim 4, wherein said processor means is responsive to coded input data taking the form of a fifth coded input signal to generate said another sequence of N numbers and, in response to coded input data taking the form of a sixth coded input signal acts to stop an automatic advance of the said another sequence produced by said third signal.

6. The circuit arrangement according to claim 5, wherein said sixth coded input signal also acts to set said processor means for generating said another sequence of N numbers.

7. The circuit arrangement according to claim 1, wherein said memory means includes non-volatile memory.

8. The circuit arrangement according to claim 7, wherein said processor means includes means responsive upon an attempted deenergization of said receiver set to store data corresponding to a last channel tuned in said non-volatile memory and active when the receiver set is again energized to read data from said non-volatile memory relative to the last channel tuned and to supply a binary number N appropriate for tuning to said last channel tuned.

9. The circuit arrangement according to claim 1, wherein the said processor means includes means for calculating said number N arithmetically on the basis of data relative to signals to be tuned and on the basis of additional pre-established data.

10. The circuit arrangement according to claim 9, wherein said arithmetical calculation is performed according to the formula:

$$N=[(K \cdot F+C) \cdot 4+S](K \times F+C)4+S$$

in which:
   N is the said number,
   K is the number of a channel to be received according to the transmission standard,
   F is the number of the step between two adjacent channels of the transmission standard,
   C is a constant which depends upon said transmission standard, and
   S is a variable number allowing alterations in the number N for tuning variations far smaller than the bandwidth of receivable channels.

11. The circuit arrangement according to claim 10, wherein data relative to signals to be tuned and stored in said memory means in digital form is represented by numbers K and S.

12. The circuit arrangement according to claim 10 wherein said processor means includes input and output means, a plurality of register means, arithmetic logic means and timing means, said plurality of register means including at least a tuning register, first and second data registers, a channel register and a mode register, said calculation of said number N being performed by said arithmetic logic means and data corresponding to said number S, said constant C, said number F, said channel number K and a defined mode of operation being stored in said tuning register, said first and second data registers, and channel register and said mode register, respectively.

13. The circuit arrangement according to claim 1, wherein said processor means includes means responsive to coded input data taking the form of a third coded input signal to terminate said automatic sequential scan of said storage locations and performs a step-by-step manual advance of said scan.

14. The circuit arrangement according to claim 1, wherein said processor means includes means responsive to coded input data taking the form of a third coded input signal to modify the value of N number obtained in response to one of said first and second coded input signals, said modification being sufficient to produce a tuning variation far smaller than the receivable channel bandwidth.

15. The circuit arrangement according to claim 1, wherein said means for selectively generating includes means actuatable by a user for generating at least said first and second coded input signals.

16. The circuit arrangement according to claim 15, wherein said means for selectively generating said coded input signals includes a keyboard containing at least ten number keys, auxiliary keys for operational-mode selection and accessory receiver control keys.

17. The circuit arrangement according to claim 1, wherein said circuit arrangement additionally includes means for displaying a tuned channel number according to the said standard and the operational mode of the circuit arrangement.

18. The circuit arrangement according to claim 1, wherein the said processor means includes a microprocessor.

19. The circuit arrangement according to claim 18, wherein said processor means includes means for receiving, identifying and storing at least one of said first and second coded input signals and means for setting corresponding means in said processor means.

20. The circuit arrangement according to claim 18, wherein said microprocessor additionally comprises:
first means responsive to an energizing of said circuit arrangement for defining inputs and outputs thereof and selecting a first output from those present on a first switch circuit;
second means responsive to an energizing of said circuit arrangement for selectively clearing said memory means;
third means responsive to a clearing of said memory means for recalling data from said memory means corresponding to a last channel tuned;
fourth means responsive to data corresponding to a last channel tuned for arithmetically calculating said number N on the basis of said corresponding data and additional pre-established data, and supplying band data signals defining a signal to be tuned.

21. The circuit arrangement according to claim 18, wherein said means for selectively generating coded input data, includes number keys, accessory keys and auxiliary operation mode selection keys for defining a mode of indirect search tuning through a scanning of data in said memory means, a mode of direct search tuning through a generation of a first sequence of N numbers corresponding to the total number of receivable radioelectric signals of a given standard and a mode of continuous search tuning through a generation of a second sequence of N numbers for scanning the whole band of receivable signals; and
said processor means including means for decoding the auxiliary mode of operation defined and being responsive thereto to cause operation in said mode decoded.

22. The circuit arrangement according to claim 21, wherein said processor means includes means for ascertaining whether said coded input data corresponds to the said indirect search operation mode, said number keys and the accessory keys, said means for ascertaining generating a predetermined series of consent signals.

23. The circuit arrangement according to claim 21, wherein said processor means includes means for determining whether said coded input data corresponds to the direct search operation mode, said number keys and said accessory keys and for generating a selected series of consent signals.

24. The circuit arrangement according to claim 21, wherein said processor means includes means for defining whether said coded input data corresponds to said continuous search operation mode, said number keys and said accessory keys and for generating a defined set of consent signals.

25. A circuit arrangement for tuning to one of a number of radioelectric signals receivable on a signal receiver set comprising:
a controllable oscillator exhibiting a variable output frequency signal depending upon a binary number N;
frequency divider means for receiving said output signal from said controllable oscillator and a sequence of coded signals representing said binary number N and producing a first output signal whose frequency depends upon said binary number N;
means for producing a reference signal having a predetermined frequency in the form of a second output signal;
comparator means for comparing said first and second output signals and producing a third signal for required tuning, said third signal being applied to said controllable oscillator for varying the output frequency thereof as a function of the binary number N;
memory means having a plurality of storage locations for storing data relative to signals tuned in digital form;
means for selectively generating coded input data; and
processor means responsive to said coded input data for supplying a sequence of coded signals representing said binary number N to said frequency divider means, said processor means being selectively responsive to said coded input data to sequentially scan said storage locations of said memory means in automatic or manual, step-by-step modes and to supply said sequence of coded signals representing said binary number N both in direct response to said coded input data and in response to data provided by said memory means, said processor means being responsive to coded input data taking the form of a first coded input signal to generate a particular sequence of N numbers for scanning the entire band of receivable radioelectric signals in increments smaller than those defined for the transmission of standard channels and responsive to coded input data taking the form of a second coded input signal to advance the number N within said particular sequence by one increment.

26. The circuit arrangement according to claim 25, wherein said processor means is responsive to coded input data taking the form of a third coded input signal to generate said particular sequence of N numbers and, is responsive to coded input data taking the form of a fourth coded input signal to stop an automatic advance of said particular sequence as also produced by said third signal.

27. The circuit arrangement according to claim 26, wherein said fourth coded input signal also sets said processor means for generating said particular sequence of N numbers.

28. A circuit arrangement for tuning to any one of a number of radioelectric signals receivable on a signal receiver set, said circuit arrangement comprising:
   means for generating a first frequency, the value of which is variable;
   means for deriving an information signal indicative of the value of the said first frequency;
   first dividing means for dividing the frequency of said information signal by a first fixed dividing ratio;
   second dividing means for dividing by a variable number N determined by a first sequence of coded signals, the frequency at the output of the first dividing means to produce a second frequency;
   means for generating a third frequency having a fixed constant value;
   means for comparing said second frequency with said third frequency to provide a signal proportional to the difference between the value of said second and third frequencies to said means for generating said first frequency for modifying the value of said first frequency;
   a manual control device including at least ten actuators actuable to generate a second sequence of coded signals; and
   a control unit connected to receive said second sequence of coded signals, said control unit including first memory means of the random access type, second and third memory means of the read only type, decoder means operative in response to signals derived from said third memory means to decode said second sequence of coded signals, reading means operative in response to signals derived from the third memory means to read data signals from said second memory means and to supply the latter's data signals to said first memory means, generating means, operative in response to signals derived from said third memory means, to generate on the basis of said signals derived from said first memory means and on the basis of signals derived from said decoder means the first sequence of coded signals representing said number N and means for supplying said first sequence of coded signals to the input of said second dividing means for generating said second frequency.

* * * * *

UNITED STATES PATENT AND TRADEMARK OFFICE
CERTIFICATE OF CORRECTION

PATENT NO. : 4,373,208
DATED : February 8, 1983
INVENTOR(S) : PIETRO BELISOMI

It is certified that error appears in the above-identified patent and that said Letters Patent are hereby corrected as shown below:

Column 12, line 65, kindly insert the following paragraph: --Thereafter, as indicated by block 213, arithmetical processing is employed to calculate the number N according to equation 3. The number N and data U and B are transferred to the two output circuits PA and PB in the manner indicated by block 214 and an enabling signal is supplied to the following blocks as shown in the Figures described previously.--.

Column 19, line 29, delete "member" and substitute therefor --number--.

Column 24, line 16, delete "the latter's" and substitute therefor --corresponding--.

Signed and Sealed this

Fifth Day of July 1983

[SEAL]

Attest:

GERALD J. MOSSINGHOFF

Attesting Officer   Commissioner of Patents and Trademarks